United States Patent
Botti et al.

(10) Patent No.: US 9,008,322 B2
(45) Date of Patent: Apr. 14, 2015

(54) EFFICIENCY OPTIMIZER OF AN AUDIO POWER AMPLIFIER FOR CAR RADIO

(75) Inventors: Edoardo Botti, Vigevano (IT); Marco Zanettini, Parma (IT); Matteo Bellitra, Certosa di Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 326 days.

(21) Appl. No.: 13/484,085

(22) Filed: May 30, 2012

(65) Prior Publication Data

US 2012/0308050 A1 Dec. 6, 2012

(30) Foreign Application Priority Data

May 31, 2011 (IT) .............................. MI2011A0985

(51) Int. Cl.
| | |
|---|---|
| H03G 3/20 | (2006.01) |
| H03F 3/181 | (2006.01) |
| H03F 1/02 | (2006.01) |
| H03F 3/72 | (2006.01) |
| H03G 3/32 | (2006.01) |
| H03G 3/34 | (2006.01) |

(52) U.S. Cl.
CPC .............. *H03F 3/181* (2013.01); *H03F 1/0211* (2013.01); *H03F 3/72* (2013.01); *H03G 3/32* (2013.01); *H03G 3/341* (2013.01); *H03G 3/344* (2013.01); *H03F 2200/03* (2013.01); *H03F 2200/393* (2013.01); *H03F 2200/78* (2013.01); *H03F 2203/7212* (2013.01)

(58) Field of Classification Search
CPC ....... H04R 3/007; H03G 3/34; H03G 1/0088; H03F 3/72

USPC ......... 381/57, 104, 107, 108, 120, 86, 95, 96, 381/121, 58, 59, 123; 330/51
See application file for complete search history.

(56) References Cited

U.S. PATENT DOCUMENTS

| | | | |
|---|---|---|---|
| 3,934,085 A | 1/1976 | Munson et al. | |
| 5,450,494 A * | 9/1995 | Okubo et al. | 381/57 |
| 5,822,598 A * | 10/1998 | Lam | 713/324 |
| 5,907,622 A * | 5/1999 | Dougherty | 381/57 |
| 6,785,392 B1 * | 8/2004 | Llewellyn | 381/120 |
| 7,394,312 B2 * | 7/2008 | Schoenberger | 330/51 |
| 8,259,961 B2 * | 9/2012 | Okumura | 381/104 |
| 8,553,908 B2 * | 10/2013 | Sugihara et al. | 381/107 |
| 2005/0190927 A1 | 9/2005 | Petroff | |
| 2012/0275624 A1* | 11/2012 | Ho et al. | 381/107 |

FOREIGN PATENT DOCUMENTS

JP          08242124 A    9/1996

* cited by examiner

*Primary Examiner* — Vivian Chin
*Assistant Examiner* — Jason R Kurr
(74) *Attorney, Agent, or Firm* — Seed IP Law Group PLLC

(57) ABSTRACT

The present invention concerns an audio amplifier circuit designed to provide an output signal to an audio transducer, said audio amplifier circuit comprising an audio power amplifier designed to receive an audio signal and designed to generate said output signal, a sensor designed to detect an audible sound having at least one noise component, to generate a detected signal. The audio amplifier circuit also includes a processing block configured to receive said detected signal at its input and to generate an off signal at its output, the latter being located at the input of said audio power amplifier. The processing block processes the detected signal according to said input signal to identify said noise component of said detected signal to generate a reference signal. The processing block generates the off signal when the value of said input signal is lower than the value of said reference signal.

27 Claims, 4 Drawing Sheets

EFFICIENCY OPTIMIZER OF AN AUDIO POWER AMPLIFIER FOR CAR RADIO

BACKGROUND

1. Technical Field

The present disclosure relates to an audio amplifier circuit and method of operation thereof.

More particularly, but without limitation, the circuit and method find their use in audio amplifiers designed for use in the automotive industry.

2. Description of the Related Art

In the field of automotive audio amplifiers, i.e., in the car audio industry, there is currently a strong need to achieve a high efficiency or, equivalently, a low consumption in terms of power not converted into sound pressure.

This need is particularly felt with the recent launch of electrically powered cars. In this type of cars the need of saving power is a particularly stringent requirement, because power savings increase the endurance of a car, thereby improving its usability.

For these reasons, manufacturers increasingly tend to install high-efficiency amplifiers in electrically powered cars, such as switching amplifiers or D class amplifiers.

Another source of power loss, which is not negligible in music, is quiescent current.

For instance, an amplifier supplied with a typical automotive battery voltage supply, i.e., 14.4V, dissipates energy even when it does not deliver power. The dissipated power may be estimated to be about 0.5-1 W per channel, even when power is not delivered through a channel of the amplifier.

It will be understood that such consumption may affect the endurance of electrically powered cars even to a considerable extent and/or, more generally, may increase consumption and hence $CO_2$ emissions in conventionally powered and/or hybrid powered cars.

BRIEF SUMMARY

One embodiment of this disclosure is obviates the problems discussed above with reference to the prior art.

One embodiment of the present disclosure is an audio amplifier circuit having the features of claim 1.

One embodiment of the present disclosure is a method of optimizing the efficiency of an audio amplifier circuit having the features of claim 14.

Some embodiments of the present disclosure provide a circuit and a method that can be used to reduce power losses caused by power dissipated even when no power is delivered through a channel of the audio amplifier.

BRIEF DESCRIPTION OF THE SEVERAL VIEWS OF THE DRAWINGS

The characteristics and the advantages of the disclosure will appear from the following detailed description of several practical embodiments, which are shown without limitation in the annexed drawings, in which.

DETAILED DESCRIPTION

Figure 1:
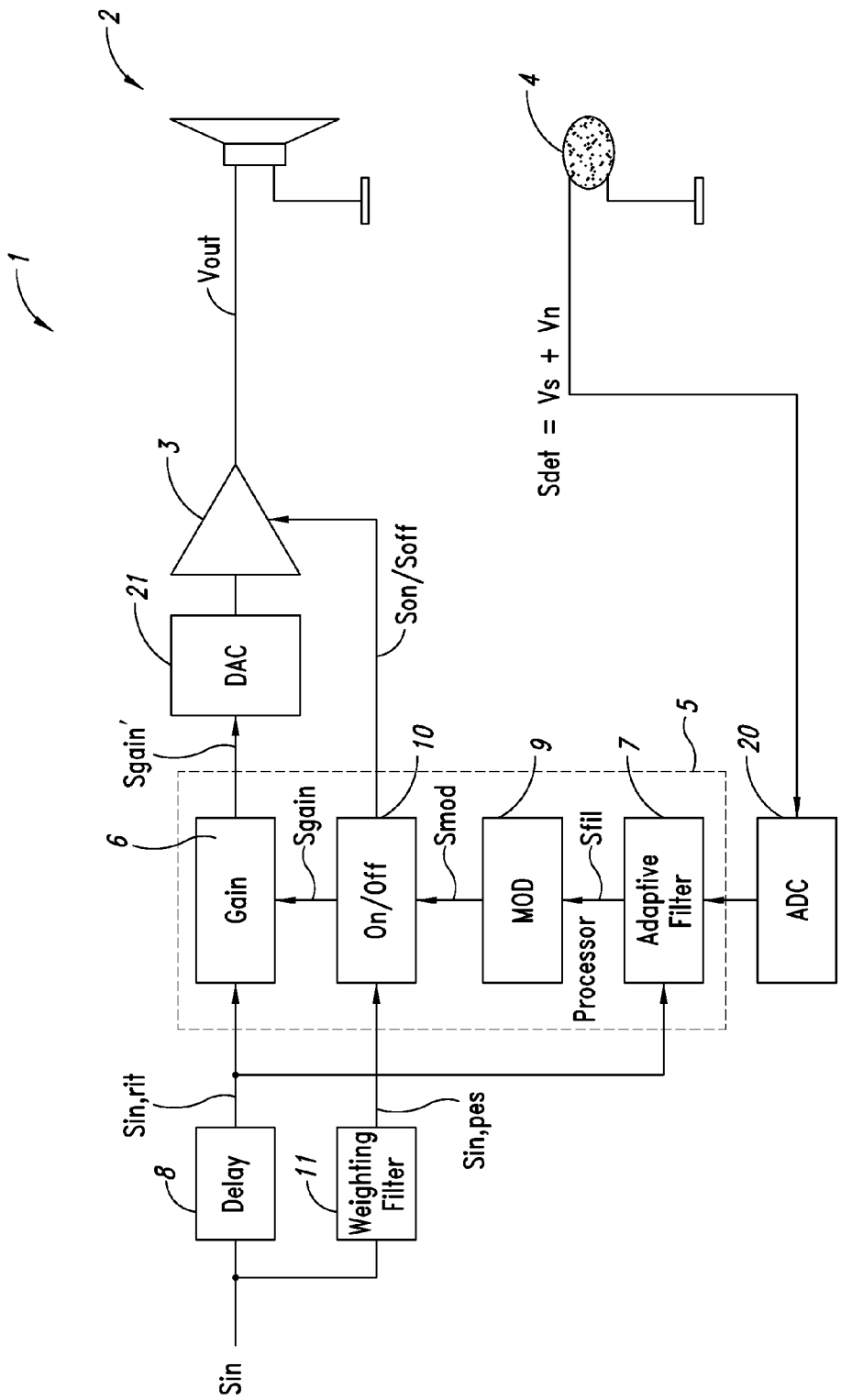
FIG. 1 shows a block diagram of a first embodiment of the audio amplifier circuit of the present disclosure.

Referring to the accompanying figures, numeral 1 designates an audio amplifier, which is designed to provide an output signal Vout to an audio transducer 2, such as a loudspeaker as is usually installed in a car.

Particularly, the audio amplifier circuit 1 comprises:

an audio power amplifier 3, preferably a switching or D class amplifier (although an AB class audio power amplifier may be also used), which is designed to receive an input audio signal Sin at its input, and is designed to generate the output signal Vout at its output, a sensor 4 designed to detect an audible sound, such audible sound having at least one noise component Vn, to generate a detected signal Sdet at its output.

It shall be first noted that the noise component Vn of the Sdet signal is the background or ambient noise as detected by the sensor 4.

In other words, the sensor 4 is adapted to detect at least the background noise or ambient noise Vn when no audible sound Vs is emitted through the acoustic transducer 2.

Conversely, if audible sounds Vs are also emitted by the acoustic transducer 2, then the sensor 4 will generate the signal Sdet, which represents the sum of the contribution of background noise or ambient noise Vn and the contribution of audible sound Vs, i.e., the sensor 4 generates a signal Sdet equal to the sum of the signal for the audible sound Vs and the signal for the ambient noise Vn, i.e., Sdet=Vs+Vn.

In order to reduce the energy loss caused by power dissipation resulting from quiescent current through the idle channel of the amplifier 3, the amplifier 3 has been advantageously designed to be off if the output signal Vout is zero or lower than a threshold value Vth.

The threshold value Vth is the minimum limit below which the user cannot hear sounds, whether these are background noise Vn or audible signals Vs.

Particularly, the threshold value Vth is equal to a value that corresponds to a sound intensity of $10^{-12}$ $W/m^2$.

This affords the technical effect of switching off the channel of the amplifier 3 that has a signal Vout lower (or zero) than the threshold value Vth, to achieve considerable power savings, and switching on the amplifier 3 as soon as the signal Vout becomes higher than Vth again.

It shall be noted that the audibility threshold value Vth may be expressed not only in terms of sound intensity, but also in equivalent terms of sound pressure, i.e., 0.000002 Pa or in terms of decibel, i.e., 0 dB.

It should be noted that such switching on/off of the amplifier 3, controlled by the signal Son/Soff, should occur without being perceived by the listener, which means that no impulsive noise that might affect listening quality should be generated during such transitions.

Furthermore, since a relatively high noise level may be present in the interior compartment of a car, due to tire rolling, engine noise and aerodynamic noise, the ambient noise component Vn is higher, and the minimum audibility threshold for the reproduced audio signal is also increased.

In one aspect of the disclosure, there is the advantageous possibility of modulating the level of the reference signal Vth below which the amplifier 3 can be switched off according to the ambient noise component Vn as detected by the sensor 4.

Figure 2:
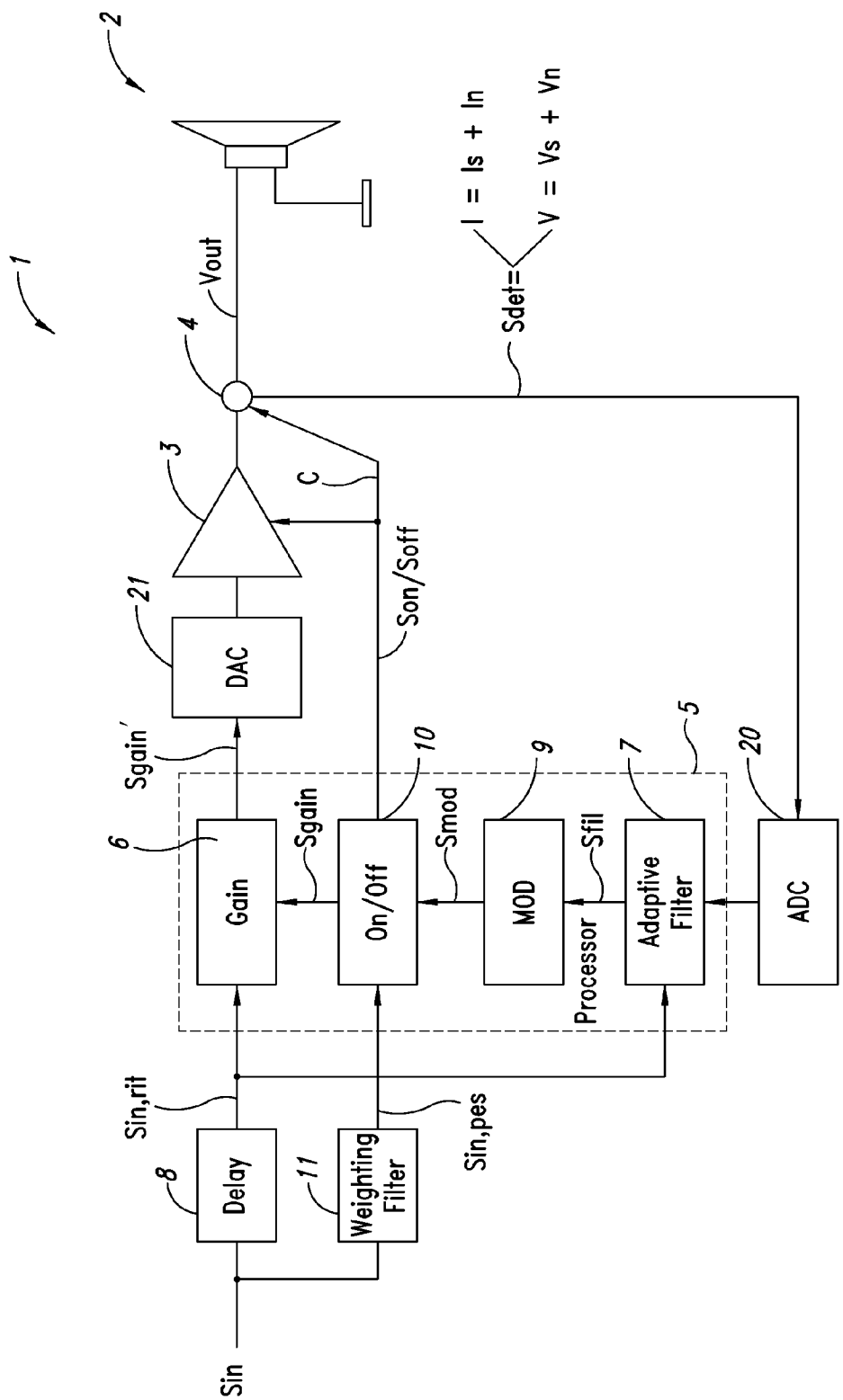
FIG. 2 shows a block diagram of a second embodiment of the audio amplifier circuit of the present disclosure.

For this purpose, also referring to FIGS. 1 and 2, it shall be noted that the circuit 1 comprises a processing block 5, which is designed to receive the detected signal Sdet at its input and to generate a switch-off signal Soff at its output, the latter signal being input to the audio power amplifier 3.

Particularly, the processing block 5 processes the detected signal Sdet according to the input signal Sin to identify the noise component Vn in the detected signal Sdet, to generate a reference signal Smod'.

If the input signal Sin is lower than the reference signal value Smod', then the block 5 generates the switch-off signal Soff, to switch off the output channel of the amplifier 3 whose level is lower than the audible threshold value.

In other words, the signal Smod' represents the reference or threshold value below which no sound is audible by the listener.

The processing block 5 also generates a signal Sgain' at its output, the latter signal being input to the power amplifier 3, to set the gain of the power amplifier 3 to a minimum value.

In order to generate the reference signal Smod', the processing block 5 may include an adaptive filter block 7, which is designed to filter said input signal Sin according to said detected signal Sdet, to generate a filtered signal Sfil.

The adaptive filter block 7 is adapted to minimize the mean-square error of the signal Sdet according to the signal Sin.

The adaptive filter 7 assumes that there is a strong correlation between the input signal Sin and the audible sound component Vs of the signal Sdet.

In other words, when the signal Sin is filtered by the adaptive filter 7, the resulting signal is as close as possible to the signal component Vs of the signal Sdet, and hence subtraction of this signal from the signal Sdet provides the noise component Vn of the detected signal Sdet.

Therefore, the adaptive filter 7 outputs the filtered signal Sfil, which represents the background or ambient noise component Vn only of such detected signal Sdet.

For instance, in a preferred embodiment, the adaptive filter 7 consists of a Least Mean Square (LMS) filter.

Furthermore, in one embodiment, in order to generate the reference signal Smod', the audio amplifier circuit 1 may comprise a delay block 8 which is designed to delay the input Sin by a predetermined interval of time to generate a delayed input signal at its output Sin,rit, which is advantageously input to the filter block 7.

It shall be noted that the interval of time may be selected according to design specifications and is preset beforehand.

Particularly, in a preferred embodiment, the adaptive filter operates with the delayed input signal Sin,rit and the detected signal Sdet at its input, to generate the filtered signal Sfil.

This processing block 5 may include an amplitude determining block 9, which is designed to receive the filtered signal Sfil at its input and generate a modulus signal Smod at its output representing the modulus of such filtered signal Sfil.

In other words, the signal Smod is representative of the amplitude value of said filtered signal Sfil, i.e., the amplitude value of the background or ambient noise component Vn of such detected signal Sdet.

Furthermore, still in order to generate the reference signal Smod', in one embodiment the processing block 5 may include an on/off block 10, which is designed to receive the signal Smod at its input and is designed to generate the on/off signal Son/Soff and a signal gain Sgain at its output.

Particularly, to avoid the noise caused when switching on/off the amplifier 3, the on/off block 10 generates the off signal Soff at its output if, at least during a first period of time T1 ranging from 70 msec to 130 msec, preferably 100 msec, the value of the input signal Sin is lower than the value of the reference signal Smod'.

It shall be noted that, also for the signal Sgain', to avoid the noise caused when switching on/off the amplifier 3, the minimum gain value for the amplifier 3 is reached within a time period T2 ranging from 10 msec to 30 msec, preferably 20 msec.

In other words, the signal Sgain' allows the gain of the amplifier 3 to be set to its minimum value and to such minimum value to be reached within the period T2.

Particularly, to set the minimum gain of the amplifier 3, in the preferred embodiment the signal Sgain' is obtained by a gain block 6.

Such gain bock 6 receives a Sgain signal generated by the on/off block 10 and the delayed input signal Sin,rit at its input, and generates the gain signal Sgain' that represents the actual gain value to be set in the amplifier, at its output.

In other words, in order to generate the signal Sgain', the gain block 6 calculates the product of the signal Sin,rit and the signal Sgain, i.e., Sgain'=Sin,rit*Sgain.

It shall be noted that the audio amplifier circuit 1 may include a weighting filter block 11 which is designed according to the sensitivity of a human ear.

The input signal Sin is input to the weighting filter block 11 to generate a signal Sin,pes, which is in turn input to the on/off block 10.

Particularly, in one aspect of the present disclosure, the on/off block 10 (or more generally the block 5) generates the off signal Soff if the input signal Sin,pes is lower than the value of the reference signal Smod'.

Now, as soon as the processing block 5 confirms that the input signal Sin,pes is lower than or equal to the reference signal Smod' during the time T1 and that the volume of the amplifier 3 is lowered to the minimum within the time T2 using the signal Sgain', the amplifier 3 may be switched off.

If the input signal Sin,pes is higher than the reference signal Smod', then the amplifier 3 is immediately switched on using the signal Son, and the volume control is brought back to a zero attenuation value, or anyway to a working value, within an interval of time ranging from 7 msec to 13 msec, preferably of 10 msec.

The circuit 1 is obviously more easily controlled in a digital environment, and the switching amplifier 3 may improve its behavior, because quick switching on/off is facilitated.

For this purpose, also referring to FIGS. 1 and 2, the input signal Sin is preferably a digital signal, whereas the detected signal Sdet is converted into a digital form through an analog-to-digital conversion block (ADC) 20.

Furthermore, the signal Sgain' is converted to analog by a digital-to-analog converter (DAC) 21 before being input to the amplifier 3.

Figure 3:
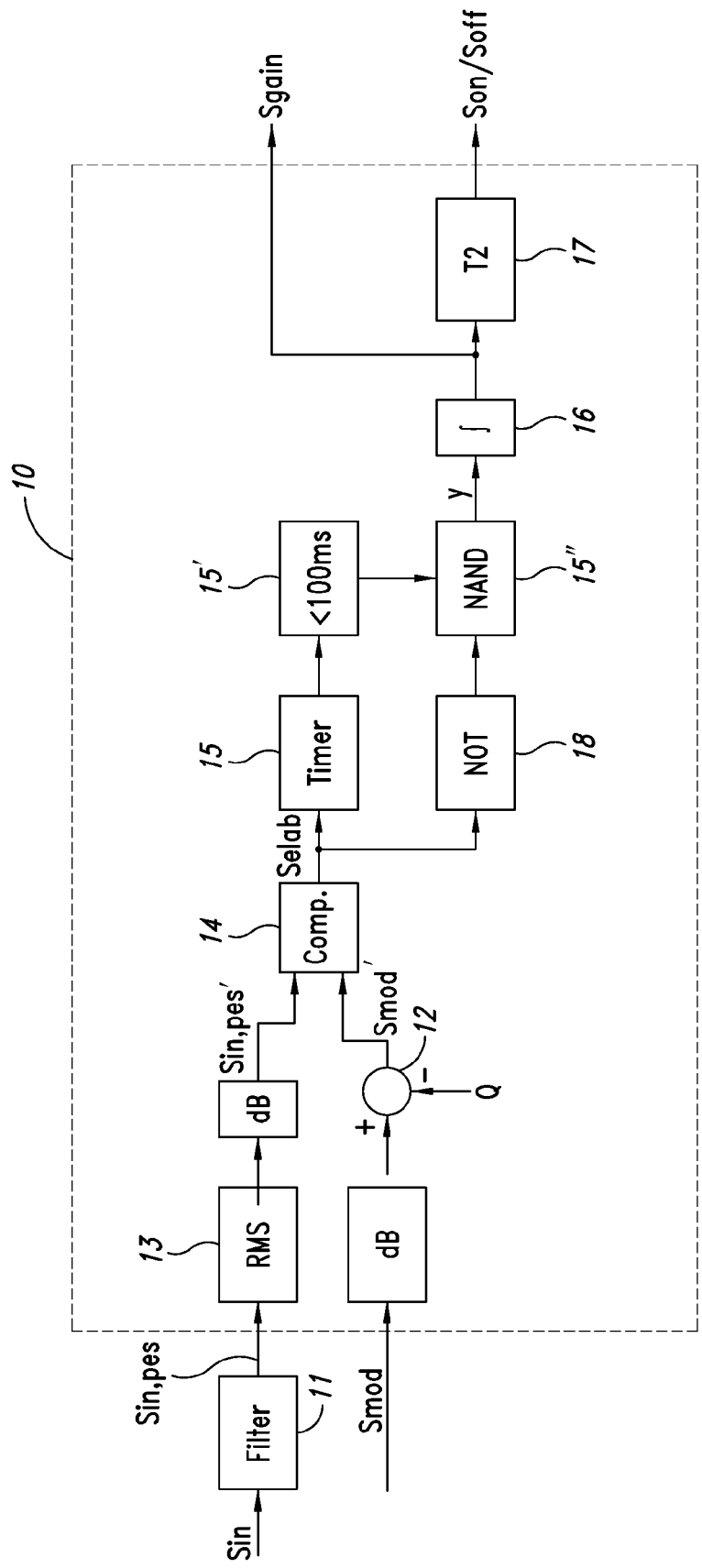
FIG. 3 shows a block diagram of a possible embodiment of a block of FIGS. 1 and 2 according to the present disclosure.
Figure 4:
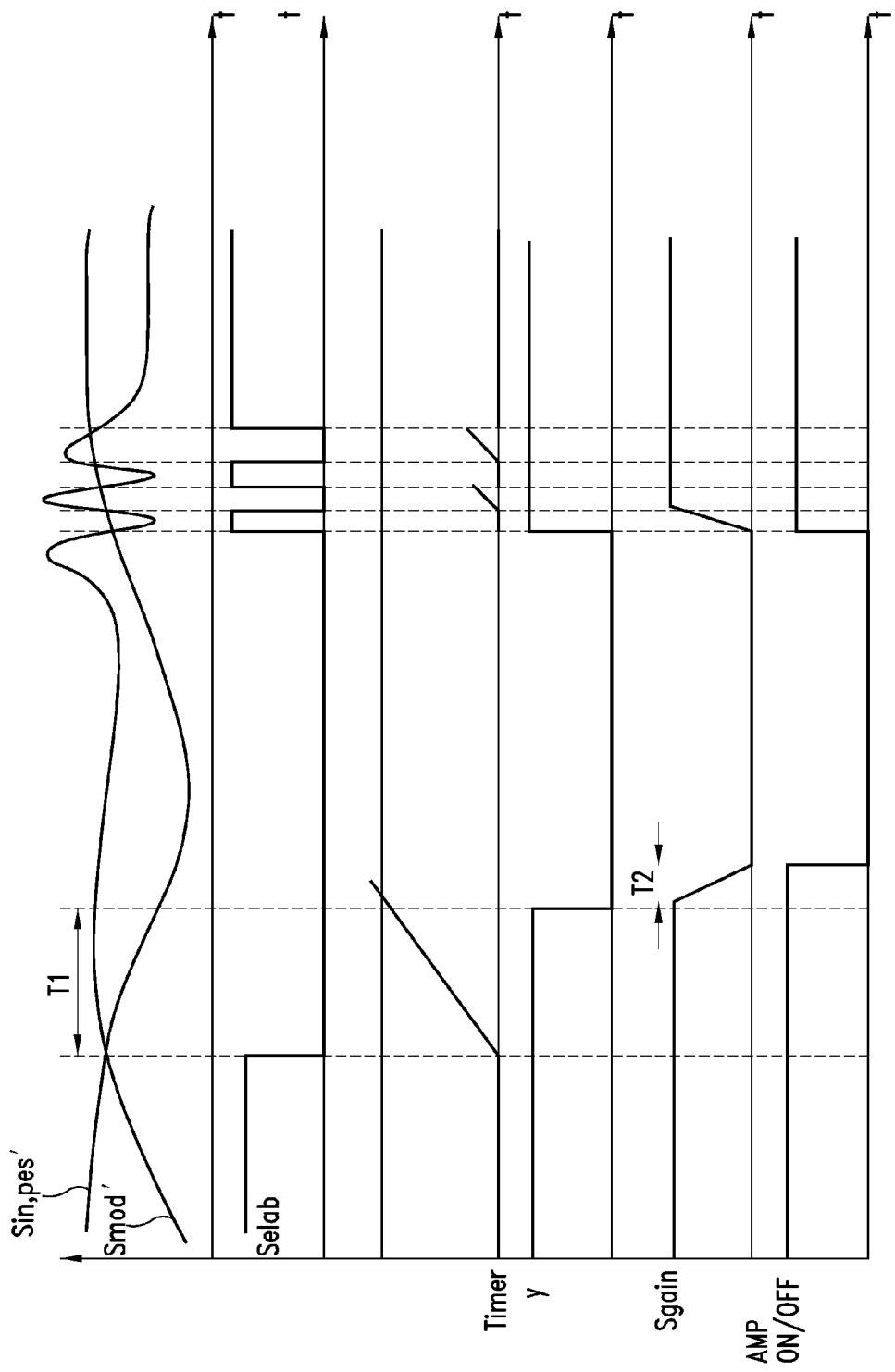
FIG. 4 shows a plurality of charts showing the curve of the amplitude of various signals in the block of FIG. 3, according to the present disclosure.

FIG. 3 shows a possible embodiment of the on/off block 10, and FIG. 4 shows its operation with time.

As mentioned above, the on/off block 10 has at its inputs the signal Smod and the input signal Sin or the version thereof that has been filtered by the weighting filter block 11 designed according to the sensitivity of a human ear, i.e., the signal Sin,pes.

Concerning the reference signal Smod', the latter is obtained by subtracting a predetermined constant quantity Q from the modulus signal Smod, i.e., the modulus noise component Vn of the signal Sdet.

Particularly, a summation node 12 is provided, which is designed to subtract the quantity Q, which is 20 dB in the diagram herein, from the modulus signal Smod, to generate the reference signal Smod'.

It shall be noted that the quantity Q represents the audibility threshold, below which the musical signal Vs cannot be heard.

The signal Sin,pes is processed by an effective value converter 13, to obtain a Root Mean Square (RMS) signal Sin, pes'.

A comparator block 14 is designed to compare the two signals Sin,pes' and Smod' and to generate a Selab signal at its output. Particularly, if the signal Sin,pes' is higher than the signal Smod', then the output of the comparator block 14, i.e., the signal Selab, is set to a high value.

The on/off block 10 also includes a timer 15, a timer threshold block 15', a NAND gate 15", an integration block 16, a threshold block 17, and a NOT gate 18. The output of the comparator block 14 is coupled to respective inputs of the timer 15 and the NOT gate 18. The output of the timer 15 is coupled to the input of the timer threshold block 15' which has an output coupled to a first input of the NAND gate 15". The output of the NOT gate 18 is coupled to a second input of the NAND gate 15" which has an output coupled to an input of the integration block 16.

Any transition from a low value to a high value of the signal Selab causes the NOT gate to transition to a low value, which causes the NAND gate to output a high value. In addition, the transition from low to high of the signal Selab causes the timer 15 to be reset, which also causes the output of the timer threshold block 15' to be low.

When the signal Selab transitions from a high value to a low value of the signal Selab causes the NOT gate 18 to output a high value and provides the start signal to such timer 15. The output of the NAND gate 15" will initially remain low high after to the NOT gate 18 transitions to the high value because the output of the timer threshold block 15" continues to be low until the timer 15' output reaches the threshold of the timer threshold block.

From the start of the timer 15, as soon as the preset threshold value of the period T1 (e.g., 100 msec) is exceeded, the timer threshold block 15' outputs a high value to the first input of the NAND gate 15", which causes the output signal y of the NAND gate to go to zero. This causes the attenuation step to be started by the signal Sgain', which is operative on the volume control of the amplifier 3 and brings it to the minimum within the period T2, i.e., within about 20 msec.

It shall be noted that, in one embodiment, the signal Sgain is obtained through the integration block 16, which is designed to perform an integration of the signal y.

As soon as the volume of the amplifier 3 reaches the minimum value, at threshold block 17, the amplifier 3 may be switched off by generation of the signal Soff.

When the signal Sin,pes' rises again above the threshold Smod', the timer 15 is reset, the signal y becomes immediately high again, the amplifier 3 is immediately switched on, and the volume control is brought to the minimum level to the working volume level within about 10 msec.

Concerning the sensor 4, also referring to FIG. 2, it is shown to comprise a microphone as generally used in the car-audio industry.

This microphone detects the audible signal component Vs and the noise component Vn to generate the detected signal Sdet at its output.

It shall be noted that the signal Sdet is sent to the processing block 5 through a dedicated connection.

Alternatively, since the presence of a microphone and relevant connections in the block diagram of FIG. 1 would cause an increase of the cost and complexity of the circuit 1, and since a dynamic microphone is conceptually identical to a dynamic microphone, then a loudspeaker subjected to an acoustic pressure may be arranged to generate an electric signal.

In other words, if a dynamic loudspeaker is subjected to sound pressure, e.g., only the sound pressure generated by the background noise component Vn in the interior of the car or the sound pressure generated by the audible component Vs and the noise component Vn, then it generates a signal that is proportional to the sound pressure itself.

The signal generated by such dynamic loudspeaker is equal to the detected signal Sdet from the microphone.

It shall be noted that the existing connection of the loudspeaker 2 to the power amplifier 3 can transfer such signal Sdet to the amplifier 3, where the "microphone" signal may be detected, and the amplitude of the output signal may be accordingly controlled.

Therefore, it will be feasible to also utilize the loudspeaker 2 as a microphone, thereby obtaining a low-cost circuit for reducing the absorbed current.

For this purpose, also particularly referring to FIG. 2, the sensor 4 may include a voltage or current sensor, which is in signal communication with the audio transducer 2 to detect the audible signal component Vs and/or the noise component Vs and generate the detected signal Sdet at its output.

Such voltage or current sensor is connected to the ADC converter 20.

It shall be noted that, when the amplifier 3 is operating, it is generally seen by the transducer 2 as an ideal voltage generator.

This means that if the transducer 2 connected thereto is subjected to a sound or acoustic pressure, it cannot change the output voltage of the amplifier 3, due to its non-zero output resistance. However, it will generate a current I having an ambient noise component In and/or an audible sound component Is, i.e., Sdet=I=Is+In.

In this case, such current I will be absorbed by the amplifier 3 and, using known techniques, it may be transformed into voltage and applied to the filter 7, possibly converted into digital by the ADC converter 20.

On the other hand, the amplifier, in the off state, will generally behave as an open circuit. This means that if the transducer 2 connected thereto is subjected to a sound or acoustic pressure, it cannot generate a current, unlike the previous case, but may generate a voltage V at the output of the amplifier 3.

The voltage V will represent the ambient noise component and/or the audible signal component Vn, i.e., V=Vs+Vn.

In this case, the output voltage V of the transducer 2 will be sent to the filter 7 or possibly to the ADC converter.

A special control C from the on/off block 10 will appropriately switch the operating mode of the current or voltage sensor that senses the acoustic signal Sdet detected by the transducer 2, i.e., by the loudspeaker operating as a microphone.

The embodiment as shown with reference to FIG. 2, affords low- or virtually zero-cost energy savings.

Average absorbed current savings are obviously a function of the type of audio program (spoken mode, music and music type) as well as the relevant level of listening volume and ambient noise.

About 10% reduction of the average absorbed current is estimated, as compared with prior art circuits.

Those skilled in the art will obviously appreciate that a number of changes and variants may be made to the arrangements as described hereinbefore to meet specific needs, without departure from the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An audio amplifier circuit configured to provide an output signal to an audio transducer, said audio amplifier circuit comprising:
    an audio power amplifier having first and second inputs and an output, the audio power amplifier being configured to receive an audio signal at the first input and generate said output signal at the output;
    an audio sensor configured to detect an audible sound, said audible sound having a noise component, said audio sensor being configured to generate a detected signal; and
    a processing block circuit configured to receive said detected signal, generate an off signal, and provide the off signal to the second input of said audio power amplifier, said processing block circuit being configured to identify said noise component of said detected signal and generate a reference signal by processing said detected signal according to said input signal, said processing block circuit also being configured to generate said off signal when a value of said input signal is lower than a value of said reference signal.

2. An audio amplifier circuit as claimed in claim 1, wherein said processing block circuit is configured to generate said off signal if, during at least a first period of time ranging from 70 msec to 130 msec, the value of said first input signal is lower than or equal to the value of said reference signal.

3. An audio amplifier circuit as claimed in claim 1, wherein said processing block circuit comprises an adaptive filter block circuit configured to filter said input signal according to said detected signal, reduce a mean-square error, and generate a filtered signal.

4. An audio amplifier circuit as claimed in claim 3, wherein said processing block circuit comprises an amplitude determining block circuit configured to receive said filtered signal and generate a modulus signal representative of an amplitude value of said filtered signal.

5. An audio amplifier circuit as claimed in claim 4, wherein said processing block circuit comprises an on/off block circuit configured to receive said modulus signal generate said off signal and process said reference signal by subtracting a quantity known from said modulus signal, said quantity representing an audibility threshold value.

6. An audio amplifier circuit as claimed in claim 5, comprising a weighting filter block circuit conformed according to a sensitivity of a human ear, said weighting filter block circuit being configured to receive and filter said first input signal and provide a filtered audio signal to said on/off block circuit, said on/off block circuit being configured to generate said off signal if a value of said filtered audio signal is lower than the value of said reference signal.

7. An audio amplifier circuit as claimed in claim 5, wherein:
    the on/off block circuit is configured to generate a first gain signal;
    the processing block circuit includes a gain block circuit configured to receive the first gain signal and said first input signal, and generate a second gain signal; and
    said gain block circuit is configured to generate said audio signal by multiplying the first input signal by said second gain signal.

8. An audio amplifier circuit as claimed in claim 1, wherein said processing block circuit is configured to generate the audio signal and provide the audio signal to the first input of said audio power amplifier and set a gain of said audio power amplifier to a minimum value.

9. An audio amplifier circuit as claimed in claim 8, wherein said power amplifier is configured to reach said minimum gain value within a period of time ranging from 10 msec to 30 msec, based on the audio signal.

10. An audio amplifier circuit as claimed in claim 1, comprising a delay block circuit configured to receive a second input signal and to generate said first input signal as a delayed version of the second input signal.

11. An audio amplifier circuit as claimed in claim 1, wherein said sensor comprises a microphone configured to detect said audible sound having said noise component and generate said detected signal.

12. An audio amplifier circuit as claimed in claim 1, wherein said sensor comprises an electrical quantity sensor coupled to said audio power amplifier and configured to be coupled to said audio transducer, the electrical quantity sensor being configured to detect said audible sound and generate said detected signal in response to a control signal from said processing block circuit.

13. An audio amplifier circuit as claimed in claim 1, comprising an analog-to-digital converter block circuit configured to convert said detected signal into a digital signal.

14. The audio amplifier circuit as claimed in claim 1 further comprising a loudspeaker coupled to the audio power amplifier, and wherein the audio sensor comprises the loudspeaker.

15. A method, comprising:
    receiving an audio input signal at a first input of a power amplifier;
    generating an output signal at an output of the power amplifier
    detecting an audible sound having a noise component, and generating a detected signal based on the audible sound, the detected signal having a noise component corresponding to the noise component of the audible sound;
    identifying said noise component of said detected signal by processing said detected signal according to said input signal and generating a reference signal;
    generating an off signal if a value of said input signal is lower than a value of said reference signal; and
    switching off the power amplifier in response to the off signal.

16. A method as claimed in claim 15, wherein said generating said off signal includes generating said off signal only if the value of said input signal is lower than the value of said reference signal during a first period of time ranging from 70 msec to 130 msec.

17. A method as claimed in claim 15, comprising:
    generating a gain signal;
    providing the gain signal to said power amplifier; and
    setting a gain of said power amplifier to a minimum value in response to the gain signal.

18. A method as claimed in claim 17, wherein setting said gain of said power amplifier comprises reaching said minimum value within a period of time, ranging from 10 msec to 30 msec, after said power amplifier is provided the gain signal.

19. An audio circuit, comprising:
an audio transducer configured to produce sound; and
an audio amplifier circuit configured to provide an output signal to the audio transducer, said audio amplifier circuit including:
  an audio power amplifier having first and second inputs and an output, the audio power amplifier being configured to receive an audio signal at the first input and generate said output signal at the output;
  an audio sensor configured to detect an audible sound having a noise component, said audio sensor being configured to generate a detected signal having a noise component corresponding to the noise component of the audible sound; and
  a processing block circuit configured to receive said detected signal, generate an off signal, and provide the off signal to the second input of said audio power amplifier, said processing block circuit being configured to identify said noise component of said detected signal and generate a reference signal by processing said detected signal according to said input signal, said processing block circuit also being configured to generate said off signal when a value of said first input signal is lower than a value of said reference signal.

20. An audio circuit as claimed in claim 19, wherein said processing block circuit comprises an adaptive filter block circuit configured to filter said input signal according to said detected signal, reduce a mean-square error, and generate a filtered signal.

21. An audio circuit as claimed in claim 20, wherein said processing block circuit comprises an amplitude determining block circuit configured to receive said filtered signal and generate a modulus signal representative of an amplitude value of said filtered signal.

22. An audio circuit as claimed in claim 19, wherein said processing block circuit comprises an on/off block circuit configured to receive said modulus signal generate said off signal and process said reference signal by subtracting a quantity known from said modulus signal, said quantity representing an audibility threshold value.

23. An audio circuit as claimed in claim 22, wherein the audio amplifier circuit includes a weighting filter block circuit conformed according to a sensitivity of a human ear, said weighting filter block circuit being configured to receive and filter said first input signal and provide a filtered audio signal to said on/off block circuit, said on/off block circuit being configured to generate said off signal if a value of said filtered audio signal is lower than the value of said reference signal.

24. An audio circuit as claimed in claim 22, wherein:
  the on/off block circuit is configured to generate a first gain signal;
  the processing block circuit includes a gain block circuit configured to receive the first gain signal and said first input signal, and generate a second gain signal; and
  said gain block circuit is configured to generate said audio signal by multiplying the first input signal by said second gain signal.

25. An audio circuit as claimed in claim 24, wherein said power amplifier is configured to reach a minimum gain value within a period of time, ranging from 10 msec to 30 msec, from receipt of the off signal.

26. An audio circuit as claimed in claim 19, wherein said processing block circuit is configured to generate the audio signal, provide the audio signal to the first input of said audio power amplifier, and set a gain of said audio power amplifier to a minimum value.

27. An audio circuit as claimed in claim 19, wherein said sensor comprises an electrical quantity sensor coupled to said audio power amplifier and configured to be coupled to said audio transducer, the electrical quantity sensor being configured to detect said audible sound and generate said detected signal in response to a control signal from said processing block circuit.

* * * * *